United States Patent [19]
Wilensky et al.

[11] 3,857,021

[45] Dec. 24, 1974

[54] MULTIPLYING CURRENT MODE DIGITAL-TO-ANALOG CONVERTER

[75] Inventors: Samuel Wilensky, Waltham; James K. Roberge, Lexington, both of Mass.

[73] Assignee: Hybrid Systems Corporation, Burlington, Mass.

[22] Filed: Apr. 3, 1972

[21] Appl. No.: 240,654

[52] U.S. Cl. ...... 235/150.52, 235/197, 340/347 DA

[51] Int. Cl. ........ G06g 7/16, G06j 1/00

[58] Field of Search ......... 340/347 DA; 235/150.52, 235/181, 193, 194

[56] References Cited

UNITED STATES PATENTS

| | | | |
|---|---|---|---|
| 2,966,302 | 12/1960 | Noolf | 235/150.52 |
| 3,177,350 | 4/1965 | Abbott et al. | 235/150.52 |
| 3,309,508 | 3/1967 | Witt | 235/150.52 |
| 3,484,589 | 12/1969 | Jernakoff | 235/150.52 |
| 3,522,420 | 8/1970 | Hartmann et al. | 235/150.52 |
| 3,573,442 | 4/1971 | Andeen | 235/150.52 |
| 3,588,479 | 6/1971 | Henderson et al. | 235/150.52 |
| 3,633,005 | 1/1972 | Leighton | 340/347 DA |
| 3,634,659 | 1/1972 | Lucas et al. | 235/150.52 |
| 3,683,165 | 8/1972 | Grobert | 235/150.52 |

*Primary Examiner*—Thomas J. Sloyan
*Attorney, Agent, or Firm*—Weingarten, Maxham & Schurgin

[57] ABSTRACT

A multiplying current mode digital-to-analog converter compatible for use in high speed and accuracy wide dynamic range applications. Within the converter a feedback control circuit responds to an analog input to provide accurate proportional control over the output of a plurality of current sources which are selectively gated by a digital input signal into a weighted current summing network. The feedback control circuit permits an accurately linear response to the analog input signal over a range including the zero input level while the current summing output insures a very high frequency response in the output signal to digital inputs for driving high frequency systems such as displays.

13 Claims, 2 Drawing Figures

MULTIPLYING CURRENT MODE DIGITAL-TO-ANALOG CONVERTER

FIELD OF THE INVENTION

This invention relates to digital-to-analog converters and in particular to multiplying digital-to-analog converters especially adapted for high speed, wide dynamic range operation.

BACKGROUND OF THE INVENTION

In typical multiplying digital-to-analog converters (DACs) an analog input signal and a digital input signal are received and processed to produce an analog output signal representative of the product of the two input signals. A popular and increasing use for such a device is with display systems where a curve is drawn in response to both an analog and digital control signal. Since such display systems must draw many such curves at a rate fast enough to give the illusion of continuous information presentation, multiplying digital-to-analog converters are required to operate with corresponding speed in responding to varying input signals, particularly digital signals.

A problem of DC analog input systems such as digital-to-analog converters is to provide a linear response to both high and low level inputs because of the inherent offsets in transistor and other solid state devices. To compensate, sophisticated reference or biasing systems can be employed, but these may degrade converter accuracy and speed with a resulting loss of usefulness for display or other applications.

BRIEF SUMMARY OF THE INVENTION

In a preferred embodiment of the present invention these requirements for a multiplying digital-to-analog converter are met by a converter having a high frequency current mode output and a feedback control system operative to accurately control the converter's response to an analog input signal through a range of input levels including both high and low levels.

The converter employs a plurality of controllable, matched current sources all of which are biased in common from the same regulated source. The control input of the current sources is taken from the analog input signal after regulation through a feedback control loop to provide an accurate proportional variation in source current with analog input signal level.

The feedback control configuration permits the current output of each source to vary continuously and linearly from zero to a predetermined maximum current in direct proportionality to the analog input signal, thus eliminating any offset limitations near the zero level for the analog input signal.

A diode is connected from each current source to a corresponding bit input in the digital input signal to selectively inhibit the current output of each source in response to the binary state of the corresponding bit input. Each source output current is weighted and summed in a resistive ladder network to provide both current or voltage output signals with a very fast response and settling time for digital input variations.

BRIEF DESCRIPTION OF THE DRAWINGS

These and other features of the invention will be more clearly perceived from the detailed description of the preferred embodiment presented below and from the accompanying drawings of which.

DETAILED DESCRIPTION OF A PREFERRED EMBODIMENT

Figures 1, 2:
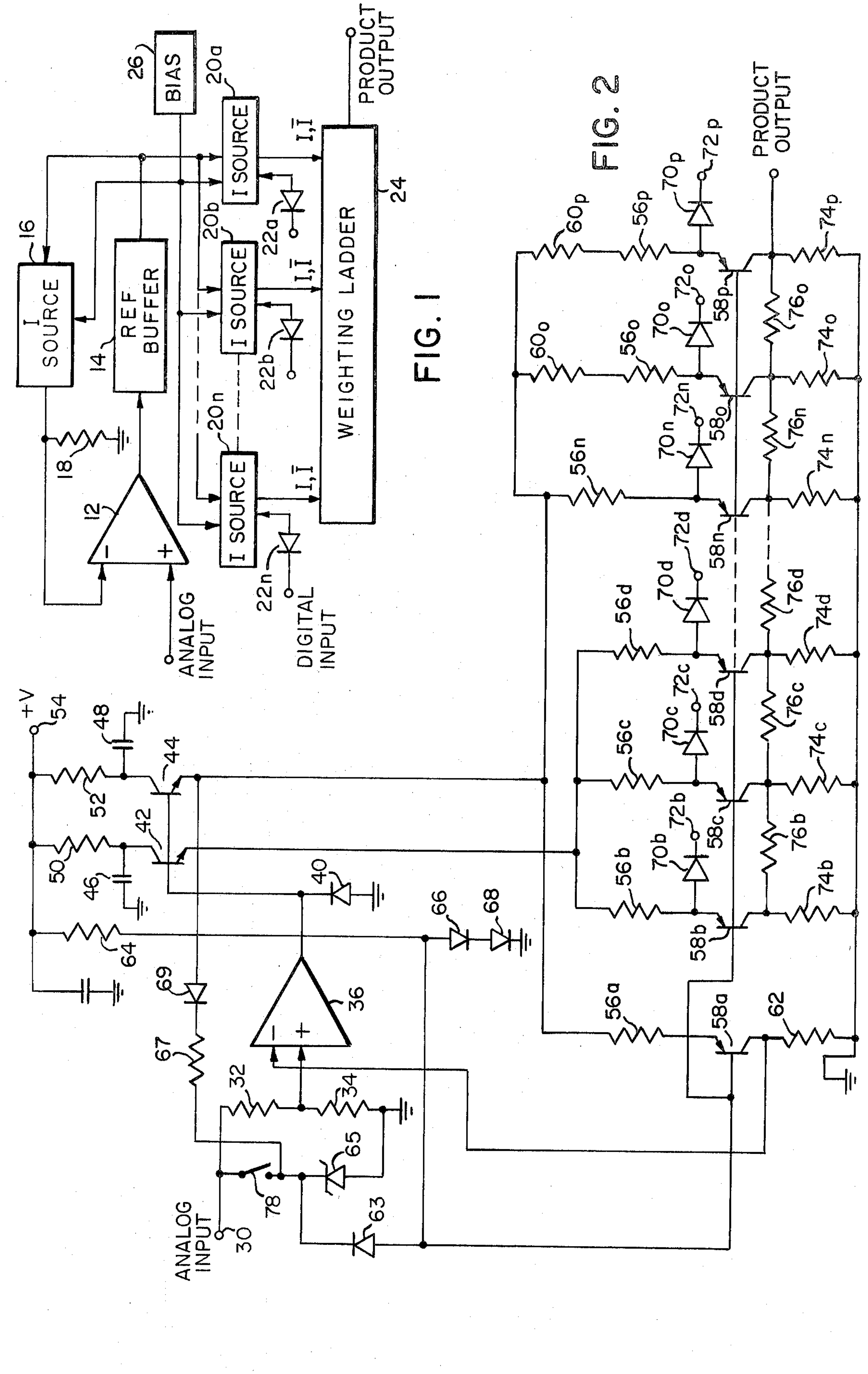
FIG. 1 is a block diagram of the functional components of the multiplying current mode digital-to-analog converter according to the invention.
FIG. 2 is a more detailed schematic representation of the converter according to the invention.

Referring to FIG. 1, there is shown in block diagram a multiplying current mode digital-to-analog converter (DAC) according to the invention and operative to provide a multiplication of an analog input signal with a digital input signal and to provide a representative analog output signal. The digital-to-analog converter incorporates a current mode output which provides a high frequency analog output for driving systems such as displays that have a fast response requirement. A feedback control circuit responds to the analog input signal to provide improved current mode accuracy and linearity over a range of analog input signals including the zero signal level.

With specific reference to FIG. 1, the analog input signal is applied to a non-inverting input of a differential input operational amplifier 12, with a feedback signal applied to an inverting input thereof. The output of amplifier 12 is applied to a reference buffer 14 which in turn applies its output to a plurality of voltage controlled current sources. One such current source 16 is connected in a feedback loop to supply a signal to the inverting input of amplifier 12. A load resistor 18 at the output of source 16 provides a voltage directly proportional to the output current as is appropriate for use by the amplifier 12.

Additional current sources 20*a*, 20*b*, . . . 20*n*, where *n* is the number of digital input bits, also respond to the voltage output of the reference buffer 14 to produce a directly proportional current output which is controlled indirectly by the feedback loop. A plurality of switching diodes 22*a*, 22*b*, . . . 22*n* are connected from each digital bit input of the digital signal input to a corresponding current source 20*a*–20*n*. The diodes 22*a*–22*n* control the current sources 20*a*–20*n* between normal and zero current outputs in accordance with the binary state of each input bit to produce the multiplication effect. The current output of each source is then applied to an input to a resistive ladder network 24 which operates to attenuate or weight the current outputs of the sources 20*a*–20*n* according to their bit position significance and to sum the weighted currents to provide the product output. A common bias source 26 provides an identical bias level to all sources 16 and 20*a*–20*n*.

By using a common biasing and control supply for a plurality of current sources and employing one of the sources in a feedback loop to regulate its current output in correspondence with the analog input, all sources are caused to provide a current output directly proportional to the analog input signal over a range from the zero level to a predetermined high level. The direct application of the digital input to control the current sources and the resistive network used to sum the current outputs insures a fast settling time in the converter's product output in response to digital signal changes.

The specific circuit implementation which provides these features can best be understood by reference to FIG. 2. Therein, the analog input signal is received on a terminal 30 and applied through a voltage divider composed of resistors 32 and 34 to a differential amplifier 36 on a non-inverting input. Depending upon the frequency response requirement for the digital-to-analog converter to the analog input signal the differential amplifier 36 can be of conventional or of more high frequency design, various selections being commercially available. Amplifier 36 will normally be stabilized by known compensation schemes, and will have an output limiting diode 40 to prevent negative amplifier outputs.

The output of amplifier 36 is applied to first and second load sharing buffer NPN transistors 42 and 44 operating in an emitter-follower mode. The collectors of these transistors are by-passed through capacitors 46 and 48 and supplied through respective resistors 50 and 52 from a voltage source 54. Resistors 50 and 52 are sufficiently low in resistance to permit transistors 42 and 44 to supply at their emitters sufficient current for the circuitry which they drive, as explained, below, without creating saturation effects.

In particular the voltage appearing at the emitter of the transistor 42 is applied through a plurality of resistors 56*b*, 56*c* and 56*d* to the emitters of respective PNP transistors 58*b*, 58*c* and 58*d*. Likewise, the voltage at the emitter of transistor 44 is applied through a plurality of resistors 56*a*, 56*n*, 56*o* and 56*p* to the emitters of respective transistors 58*a*, 58*n*, 58*o* and 58*p*. Additional low value trimming resistors 60*o* and 60*p* are connected in series with resistors 56*o* and 56*p*, respectively, for making fine adjustments in the most significant bits of the digital input signal as will be explained below.

The transistors 58*a*–58*p* are preferably selected for speed, low capacitance and high Beta and are matched particularly in Vbe (emitter-base voltage) characteristics to provide consistent operation of all transistors. Similarly, resistors 56*b*–56*p* are are accurately selected for identical, preselected values, trimming resistors 60*o* and 60*p* providing fine adjustments for the values of resistors 56*o* and 56*p*. The number of transistor stages 58*b*–58*p* is determined by the number of bits in the digital input signal and may typically be 12 without loss of accuracy in each bit.

The transistor 58*a* provides a reference current which is conducted through a collector resistor 62 to ground. It is supplied from the same transistor 44 as are the most significant bit transistors 58*o* and 58*p*. The collector of transistor 58*a* applies a voltage determined by the conversion of current flowing through resistor 62 to an inverting input of the amplifier 36.

The bases of transistors 58*a*–58*p* are biased in common through a resistor 64 from source 54. These bases are fixed in their bias voltage by series diodes 66 and 68 connected from resistor 64 to ground. A diode 63 conducts from the base of transistor 58*a* through a Zener diode 65 which is in turn supplied through series resistor 67 and diode 69 from the emitter of transistor 44 for use as a reference as explained below. Diode 63 insures positive voltage to Zener 65 during turn-on and is cut off when the Zener is at full breakdown level. The Zener supply is tied to the signal applied to the current sources at the most significant bit positions to provide stability.

As can now be appreciated, the analog signal applied to amplifier 36, after attenuation to provide appropriate scaling, is differenced with a voltage directly proportional to the current flowing out of the collector of transistor 58*a*. That current is determined by the output of amplifier 36 as buffered by transistor 44 and applied to resistor 56*a* in the emitter circuit of transistor 58*a*. Using the techniques of proportional feedback control, the current applied through resistor 62 will be adjusted by amplifier 36 until its two inputs achieve a predetermined minimal difference which can be made as small as system accuracy requires by suitably selecting the gain and offset properties of amplifier 36. Since all transistors 58*b*–58*p* are biased by the same voltage used to bias transistor 58*a*, receive the same voltage across the resistors 56*b*–56*p* in their emitter circuits, and are further matched in their characteristics, the current output at the collector of the transistors 58*b*–58*p* will be regulated in direct proportionality to the current from transistor 58*a* and correspondingly the voltage magnitude of the analog input signal. It can also be appreciated that by using current feedback control, the analog input signals may be permitted to diminish to zero without any disturbance in the linearity of the corresponding currents provided by transistor 58*a* and transistors 58*b*–58*p*.

Digital control of the current supplied by the transistors 58*b*–58*p* in correspondence with the digital input signal is provided by a plurality of diodes 70*b*–70*p* which are connected for conduction from the emitters of the transistors 58*b*–58*p* to corresponding digital input terminals 72*b*–72*p*, one provided for each bit of digital input.

When any bit input is at the zero binary level, the corresponding diode reduces the emitter voltage to backbias the emitter-base junction and prevent conduction by the corresponding transistor. When that bit input is at the one binary level, the corresponding diodes are backbiased and the associated transistors allowed to conduct in correspondence with the analog input signal level.

To provide an output signal corresponding in level to the product of the analog and digital input signals, a resistive ladder network is employed to weigh the current provided by each transistor 58*b*–58*p* according to its corresponding bit position in the digital input signal. The ladder network also provides current summing to produce the composite analog output signal. Accordingly, the current output of each transistor 58*b*–58*p* is conducted to ground through respective resistors 74*b*–74*p*. Also, the collectors of each transistor are connected to the collector of the adjacent transistor through respective resistors 76*b*–76*o*.

As can be seen, current, from the transistors 58*o* and 58*p*, for the most significant bits in the digital input signal, are attenuated the least and must be most accurately adjusted. It is for this purpose that trimming resistors 60*o* and 60*p* are provided. Where necessary additional trimming resistors may be used in other stages of the most significant bits. If higher accuracy resistors are employed, trimming resistors may be unnecessary.

A switch 78 is provided in a normally open state between the terminal 30 and Zener regulating diode 65.

When it is desired to use the converter of FIG. 2 as a digital-to-analog converter without multiplication by a varying analog input signal, the switch 78 is closed to substitute the reference signal of the diode 65 for the analog input. The current bias for the Zener 65, with switch 78 closed, is regulated by feedback from transistor 44 against disturbances from supply 54 voltage variations.

Having above described a preferred embodiment of the present invention, it will occur to those skilled in the art that modifications and alterations of specific circuitry can be utilized without departing from the spirit of the invention. It is accordingly intended to limit the scope of the invention only as indicated in the following claims.

What is claimed is:

1. A multiplying digital-to-analog converter comprising:

means for receiving an analog input signal for multiplication;

means for receiving a digital input signal for multiplication by said analog input signal;

a plurality of controllable current sources each responsive to an analog control signal and producing a current output signal representative of said control signal;

means for providing a feedback signal from one of the current output signals;

means receiving said analog input signal and said feedback signal for generating said analog control signal representing the difference between said analog input signal and said feedback signal over a range of values for said analog signal including very low signal levels, whereby said feedback signal provides in said control signal regulation of the operation of the other of said plurality of current source means;

means operative in response to each bit of said digital signal for selectively inhibiting a current output from corresponding ones of said plurality of controllable current sources in correspondence with the binary state of the bit; and low settling time means for summing said selectively inhibited current output signals in a weighted manner to produce an analog output signal proportional to the magnitude represented by said digital input signal multiplied by the magnitude represented by said analog input signal.

2. The multiplying digital-to-analog converter of claim 1, further including:

means for providing a constant signal in response to a current flowing therethrough;

switchable means for alternatively providing said constant signal in place of said analog input signal; and means for providing the current for said constant signal from said control signal to provide regulation of said constant signal.

3. The multiplying digital-to-analog converter of claim 2, further including means for preventing a reverse current flow through said constant signal providing means during turn-on transients in said converter, said reverse current flow being in a direction opposite to the current flow providing said constant signal.

4. The multiplying digital-to-analog converter of claim 1, further including means for limiting said analog control signal to one polarity.

5. The multiplying digital-to-analog converter of claim 1 wherein said analog control signal generating means and said reference signal providing means are operative to produce said control signal and said reference signal respectively in the same polarity as said analog input signal.

6. A multiplying digital-to-analog converter comprising:

means for receiving an analog input signal for multiplication;

means for receiving a digital input signal for multiplication by said analog input signal;

feedback controlled means responsive to said analog input signal and a feedback control for generating a reference signal of the same polarity as said analog input signal and varying linearly with said analog input signal from a zero signal level to a predetermined greater signal level;

a plurality of current sources controlled by said feedback controlled means for producing a plurality of current output signals varying with said reference signal;

each bit in said digital signal corresponding to a current output of said pulrality of current sources;

means for applying said feedback control to said feedback controlled means in response to one of said current output signals whereby said feedback control provides in said reference signal regulation of the operation of said plurality of current sources;

means for selectively inhibiting current from corresponding ones of said plurality of sources for producing an output signal representing a weighted summation of the plurality of output currents from said plurality of sources and thereby representing the product of the magnitudes represented by said analog input signal and said digital input signal.

7. A multiplying digital-to-analog converter including:

means for receiving an analog input signal for multiplication;

means for receiving a digital signal for multiplication with said analog input signal;

means for generating a difference signal to represent a difference between said analog input signal and a feedback signal;

means for producing a bias signal;

current source means operative under the control of said bias signal for converting said difference signal to a current representation thereof;

means for providing said feedback signal from said current representation of said difference signal;

a plurality of controllable current sources each responsive to said difference signal and operative under the control of said bias signal for generating a current output proportional to said feedback signal;

means for providing an output signal representing a weighted summation of said current outputs produced by said plurality of converters; and a plurality of means each associated with a respective one of said plurality of converters and each responsive to a respective bit signal of said digital signal for selectively inhibiting the production of current by the associated converter in response to a predetermined state of said bit in said digital signal thereby to cuase said output signal to represent the product of the magnitude represented by said digital signal and the magnitude of said analog input signal.

8. The multiplying digital-to-analog converter of claim 7, further including means for regulating said bias signal with respect to said difference signal whereby variations therebetween reflect variations in said analog input signal.

9. A current mode multiplying digital-to-analog converter comprising:

means for receiving an analog input signal for multiplication;

means for receiving a digital signal for multiplication with said analog input signal;

means for providing a control signal representing the difference of said analog input signal and a feedback signal;

feedback means supplying said feedback signal including:

a first controlled conduction semiconductor device having first, second and bias terminals and operative to provide conduction between said first and second terminals under the control of bias signals applied to said bias terminal;

a first resistor for applying said control signal to said first terminal of said first semiconductor device;

means for providing said bias signal for application to said bias terminal of said first semiconductor device; and means receiving the current output of said second terminal of said first semiconductor device for generating said feedback signal representative of said current output;

a plurality of semiconductor devices each having first, second and bias terminals and matched to the characteristics of said first semiconductor device and each corresponding to a respective bit of said received digital signal;

a plurality of resistors for applying said control signal to said plurality of semiconductor devices at the first terminals thereof;

means for applying said bias signal to the bias terminals of said plurality of semiconductor devices;

said plurality of semiconductor devices having substantially equal output currents at second terminals thereof, said equal output currents varying proportionally with said reference signal;

means for producing an output signal representative of a weighted summation of the current outputs of said plurality of semiconductor devices; and means for providing conduction from said first terminals to said second terminals of said plurality of semiconductor devices of the current applied through said plurality of resistors in response to a predetermined binary state of corresponding bits of said received digital signal.

10. The current mode multiplying digital-to-analog converter of claim 9 wherein:

said first semiconductor device and said plurality of semiconductor devices are semiconductor transistors matched in emitter-base voltage characteristics and having high gain and speed characteristics;

the first, second and bias terminals of said semiconductor devices being the emitters, collectors and bases respectively thereof.

11. The current mode multiplying digital-to-analog converter of claim 9 wherein said conduction providing means includes switching diodes connected to shunt the current flowing through said plurality of resistors to the low state bit inputs of said digital signal.

12. The current mode multiplying digital-to-analog converter of claim 9 further including buffer amplifying means responsive to said control signal to provide:

a first control signal for application to said first semiconductor device and the semiconductor devices of said plurality of semiconductor devices corresponding to the most significant bit positions of said digital signal; and a second control signal for application to the semiconductor devices of said plurality of semiconductor devices corresponding to the least significant bit positions of said digital signal.

13. The current mode multiplying digital-to-analog converter of claim 9 wherein the one or more resistors of said plurality of resistors associated with the most significant bit positions of said digital signal include trimming resistors for enabling fine adjustment in the resistance between said control signal and the first terminals of said semiconductor devices corresponding to the most significant bit positions of said digital signal.

* * * * *